US008258510B2

(12) United States Patent
Kim et al.

(10) Patent No.: US 8,258,510 B2
(45) Date of Patent: Sep. 4, 2012

(54) THIN FILM TRANSISTOR, DISPLAY DEVICE INCLUDING THE SAME, AND METHOD OF MANUFACTURING THE DISPLAY DEVICE

(75) Inventors: Joo-Han Kim, Yonin-si (KR); Seung-Hwan Shim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/390,020

(22) Filed: Feb. 20, 2009

(65) Prior Publication Data

US 2009/0212288 A1      Aug. 27, 2009

(30) Foreign Application Priority Data

Feb. 25, 2008   (KR) .................. 10-2008-0016860

(51) Int. Cl.
*H01L 29/04*           (2006.01)
(52) U.S. Cl. ......................... 257/57; 257/59; 438/158

(58) Field of Classification Search ............... 257/57, 257/59; 438/158
See application file for complete search history.

(56) References Cited

U.S. PATENT DOCUMENTS

| | | | |
|---|---|---|---|
| 5,731,216 A * | 3/1998 | Holmberg et al. | 438/30 |
| 5,834,797 A * | 11/1998 | Yamanaka | 257/57 |
| 6,001,748 A * | 12/1999 | Tanaka et al. | 438/791 |
| 6,624,473 B1 * | 9/2003 | Takehashi et al. | 257/344 |
| 2004/0061176 A1 * | 4/2004 | Takafuji et al. | 257/347 |
| 2005/0105037 A1 * | 5/2005 | Kim et al. | 349/151 |

\* cited by examiner

*Primary Examiner* — Jami M Valentine
(74) *Attorney, Agent, or Firm* — Innovation Counsel LLP

(57) ABSTRACT

A display device including the thin film transistor, and a method of manufacturing the display device are provided. The thin film transistor comprising a first gate electrode, a second gate electrode formed on the first gate electrode, a first semiconductor formed on the first gate electrode and including a polycrystalline semiconductor, a second semiconductor formed on the second gate electrode and including an amorphous semiconductor.

19 Claims, 6 Drawing Sheets

THIN FILM TRANSISTOR, DISPLAY DEVICE INCLUDING THE SAME, AND METHOD OF MANUFACTURING THE DISPLAY DEVICE

CROSS-REFERENCE TO RELATED APPLICATION

This application claims priority from Korean Patent Application No. 10-2008-0016860 filed on Feb. 25, 2008 in the Korean Intellectual Property Office, the disclosure of which is incorporated herein by reference in its entirety.

BACKGROUND OF THE INVENTION

1. Field of the Invention

The present invention relates to a thin film transistor, a display device including the thin film transistor, and a method of manufacturing the display device.

2. Description of the Related Art

Display devices, such as liquid crystal displays, organic light emitting diode (OLED) displays, and electrophoretic displays, include a plurality of pixels. Each of the pixels includes a pair of electromagnetic field generating electrodes and an optical active layer therebetween. For example, a liquid crystal displays includes a liquid crystal capacitor where a liquid crystal layer is interposed between electromagnetic field generating electrodes as an optical active layer, and an OLED display includes an OLED element where an organic light emitting layer is interposed between electromagnetic field generating electrodes as an optical active layer.

The display device includes a switching element connected to one of a pair of field-forming electrodes to switch an electrical signal, and an optical active layer converts the electrical signal into an optical signal, thereby displaying an image. Here, the switching element receives a data signal from a data line according to a scanning signal from a gate line to transmit the data signal to a pixel electrode, and typically consists of thin film transistors.

The field-forming electrodes, the switching element, the gate line, the data line, and the like are provided on one or more display panels.

The display device includes a gate driver that applies scanning signals to gate lines and a data driver that applies data signals to data lines. The gate driver and the data driver are driven by control signals transmitted from a signal controller, and the like. In recent years, attempts have been frequently made to form the gate driver and the data driver on the same display panel with the field-forming electrodes, the switching element, and the like. In such cases, the gate driver and the data driver include active elements made of thin film transistors.

Meanwhile, an OLED display may further include a driving transistor as well as a switching element to allow electric current to flow through an organic light emitting diode according to the data signal supplied from the switching element.

Due to high mobility and on-current, a thin film transistor using a polycrystalline semiconductor (or a polycrystalline-semiconductor thin film transistor) draws much attention as an element required for a gate or data driving integrated circuit (IC) mounted on a display panel together with a switching element.

In order to manufacture the polycrystalline-semiconductor thin film transistor, however, a crystallization process, an impurity injection process, and an activation process are additionally required. Moreover, the thin film transistor has many restrictions on its application as a switching element of a pixel unit due to a higher leakage current than a conventional thin film transistor using an amorphous semiconductor (or amorphous-semiconductor thin film transistor).

In this situation, there have been active attempts to form a driving unit with a polycrystalline-semiconductor thin film transistor and form a pixel unit with an amorphous-semiconductor thin film transistor by exploiting unique advantages of the polycrystalline-semiconductor thin film transistor and the amorphous-semiconductor thin film transistor. By forming the polycrystalline-semiconductor thin film transistor simultaneously with formation of the amorphous-semiconductor thin film transistor without a need for a separate mask process, additional cost and time can be minimized.

As mentioned above, in spite of high mobility, the polycrystalline-semiconductor thin film transistor reduces an operation range of a driving IC due to its high leakage current.

Moreover, in a general thin film transistor having an inverted stagger structure, a channel region is defined by a source pattern and a drain pattern. For this reason, the etching dispersion of source and drain patterns is reflected into the electric characteristic dispersion of the thin film transistor.

SUMMARY OF THE INVENTION

The present invention provides a thin film transistor, a display device including the thin film transistor, and a method of manufacturing the display device, whereby a plurality of thin film transistors having different characteristics are simultaneously formed on the same display panel, a thin film transistor having a short channel is formed to increase on-current and thus to reduce a high leakage current, and the uniformity of the electric characteristics of a polycrystalline-semiconductor thin film transistor is improved regardless of the etching dispersion of a source pattern and a drain pattern.

The above and other objects of the present invention will be described in or be apparent from the following description of the preferred embodiments.

According to an aspect of the present invention, there is provided thin film transistor comprising a first gate electrode, a second gate electrode formed on the first gate electrode, a first semiconductor formed on the first gate electrode and including a polycrystalline semiconductor, a second semiconductor formed on the second gate electrode and including an amorphous semiconductor.

According to another aspect of the present invention, there is provided a display device including a first thin film transistor including a first circuit gate electrode, a second circuit gate electrode, a first circuit semiconductor, a second circuit semiconductor, a circuit source electrode, and a circuit drain electrode; and a second thin film transistor including a first pixel gate electrode, a second pixel gate electrode, a pixel semiconductor, a pixel source electrode, and a pixel drain electrode, wherein the first circuit semiconductor includes a polycrystalline semiconductor, and the second circuit semiconductor and the pixel semiconductor includes an amorphous semiconductor.

The first circuit semiconductor, the second circuit semiconductor, and the pixel semiconductor may be formed on the same layer.

A width of the second circuit semiconductor may be the same as a width of the second circuit gate electrode. A width of the second circuit gate electrode may be smaller than a width of the first circuit gate electrode and the second circuit gate electrode does not overlap the first circuit semiconductor.

The first circuit gate electrode and the first pixel gate electrode may be formed of a transparent conductive layer, and the second circuit gate electrode and the second pixel gate electrode may be formed of a metal layer.

The thin film transistor may be positioned in at least one of a gate driver and a data driver.

According to still another aspect of the present invention, there is provided a display device including a first thin film transistor including a first circuit gate electrode, a second circuit gate electrode, a first circuit semiconductor, a second circuit semiconductor, a circuit source electrode, and a circuit drain electrode, and a second thin film transistor including a first pixel gate electrode, a second pixel gate electrode, a pixel semiconductor, a pixel source electrode, and a pixel drain electrode, wherein the first circuit semiconductor includes a polycrystalline semiconductor, and the second circuit semiconductor and the pixel semiconductor includes an amorphous semiconductor.

The first circuit semiconductor, the second circuit semiconductor, and the pixel semiconductor may be formed on the same layer.

A width of the second circuit semiconductor may be the same as a width of the second circuit gate electrode.

The first circuit gate electrode and the first pixel gate electrode may be formed of a transparent conductive layer, and the second circuit gate electrode and the second pixel gate electrode may be formed of a metal layer.

The display device may further include a storage upper electrode and a storage lower electrode.

At least one of the storage upper electrode and the storage lower electrode may be formed of a transparent conductive layer.

The first thin film transistor may be positioned in at least one of a gate driver and a data driver, and the second thin film transistor may be positioned in a pixel unit.

According to a further aspect of the present invention, there is provided a method of manufacturing a display device, the method including forming a first circuit gate electrode and a first pixel gate electrode; forming a second circuit gate electrode and a second pixel gate electrode on the first circuit gate electrode and the first pixel gate electrode, respectively, forming a gate insulating layer, an amorphous semiconductor layer, and an ohmic contact layer on the second circuit gate electrode and the second pixel gate electrode; forming a circuit source electrode, a circuit drain electrode, a pixel source electrode, and a pixel drain electrode on the ohmic contact layer; removing portions of the ohmic contact layer, which are exposed between the circuit source electrode and the circuit drain electrode and between the pixel source electrode and the pixel drain electrode; forming a first circuit semiconductor made of a polycrystalline semiconductor and a second circuit semiconductor made of an amorphous semiconductor by crystallizing at least a portion of the amorphous semiconductor layer; forming an insulating layer on the circuit source electrode, the circuit drain electrode, the pixel source electrode, and the circuit drain electrode; and forming a transparent conductive layer connected with at least one of the circuit source electrode, the circuit drain electrode, and the circuit drain electrode.

The forming of the first circuit semiconductor and the second circuit semiconductor may include irradiating a laser beam to the amorphous semiconductor from a rear side of the first circuit gate electrode.

The forming of the first circuit gate electrode and the second circuit gate electrode may include exposing to light using a mask having a slit.

The first thin film transistor may be constituted by the first and second circuit gate electrodes, the first and second circuit semiconductors, the ohmic contact layer, the circuit source electrode, and the circuit drain electrode; the second thin film transistor may be constituted by the first and second pixel gate electrodes, a pixel semiconductor made of an amorphous semiconductor, the ohmic contact layer, the pixel source electrode, and the pixel drain electrode; the first thin film transistor may be positioned in a driving unit; and the second thin film transistor may be positioned in a pixel unit.

The method of the display device may further include forming a storage electrode in the pixel unit.

The storage electrode may include storage electrode may include a storage upper electrode and a storage lower electrode, and the storage lower electrode is formed of the same material as the first circuit gate electrode or the first pixel gate electrode.

The forming of the storage lower electrode may include exposing the storage lower electrode using a mask having a slit.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
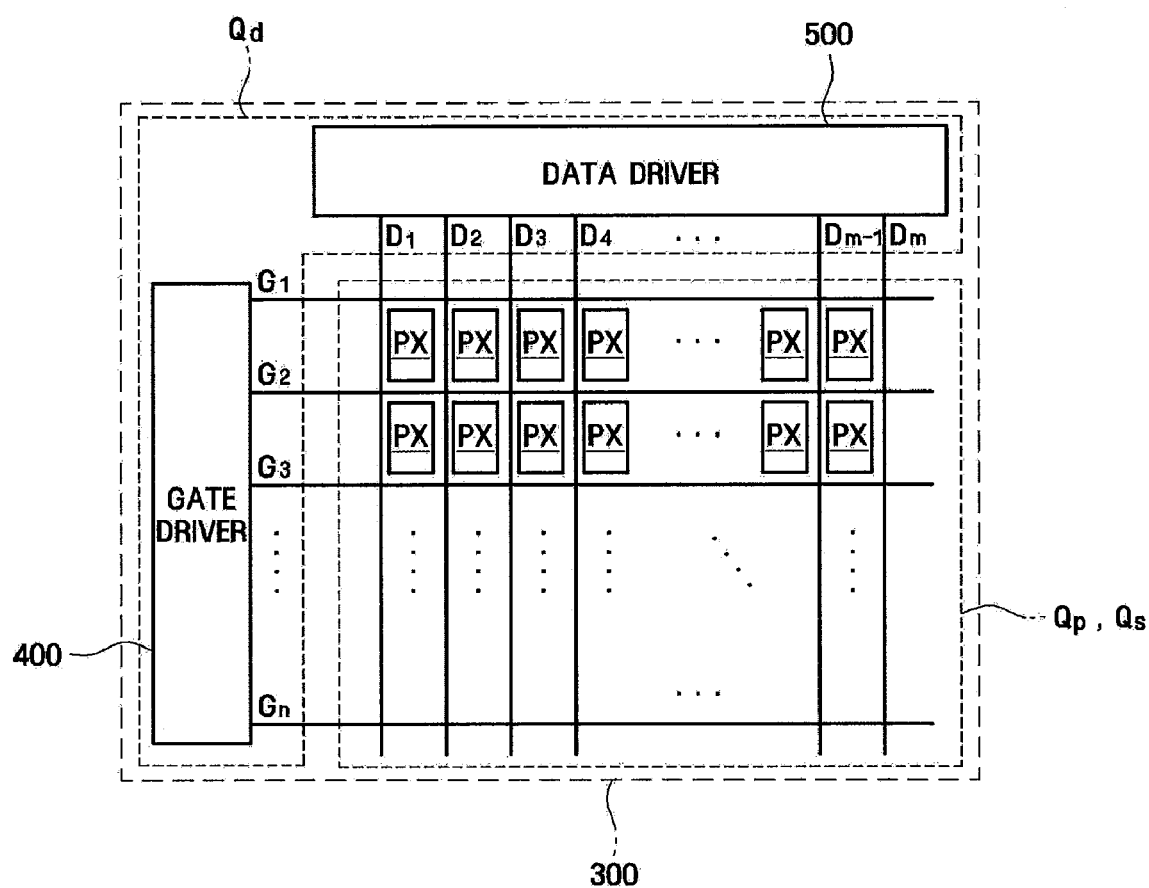
FIG. 1 is a schematic diagram of a display device according to an embodiment of the present invention.

Embodiments of the present invention may be understood more readily by those skilled in the art with reference to the following detailed description of and the accompanying drawings. The present invention may, however, be embodied in many different forms and should not be construed as being limited to the embodiments set forth herein. In the drawings, the thickness of various layers and regions are exaggerated for clarity. Like reference numerals refer to like elements throughout the specification. It will be understood that when an element such as a layer, region or substrate is referred to as being "on" another element, it can be directly on the other element or intervening elements may also be present.

Hereinafter, a display device according to an embodiment of the present invention will be described with reference to FIG. 1.

FIG. 1 is a schematic diagram of a display device according to an embodiment of the present invention.

Referring to FIG. 1, the display device includes a display panel assembly 300 composed of one or two display panels.

The display panel assembly 300 includes a plurality of pixels PX, a plurality of gate lines $G_1$-$G_n$, a plurality of data lines $D_1$-$D_m$, a gate driver 400, and a data driver 500.

The plurality of gate lines $G_1$-$G_n$ transmit gate signals, and the plurality of data lines $D_1$-$D_m$ transmit data signals to individual pixels and perpendicular to the gate lines $G_1$-$G_n$.

The pixels PX are connected to the plurality of gate lines $G_1$-$G_n$ and the plurality of data lines $D_1$-$D_m$ and are arranged in a matrix (pixel array). Each pixel PX includes a switching element (not shown) formed of a thin film transistor.

The gate driver 400 is connected to the gate lines $G_1$-$G_n$ of the display panel assembly 300, and applies the gate signals composed of a combination of a gate-on voltage Von and a gate-off voltage Voff to the gate lines $G_1$-$G_n$.

The data driver 500 is connected to the data lines $D_1$-$D_m$ of the display panel assembly 300, and applies the data signals to the data lines $D_1$-$D_m$.

The gate driver 400 and the data driver 500 include a plurality of thin film transistors (not shown) for generating the gate signals and the data signals and controlling the same, respectively.

Figure 2:
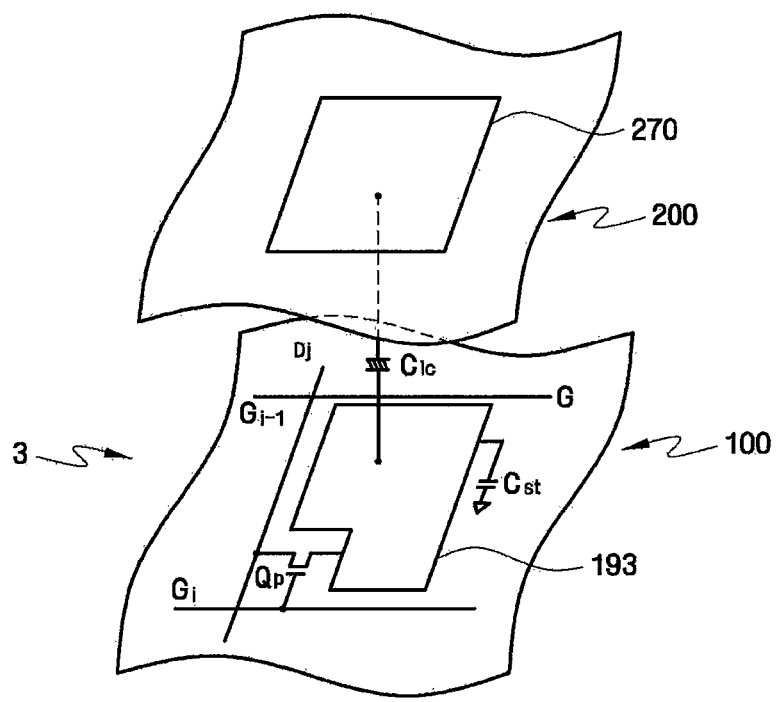
FIG. 2 is an equivalent circuit diagram of a pixel of a liquid crystal display (LCD) according to an embodiment of the present invention.

A liquid crystal display according to an embodiment of the present invention will now be described with reference to FIG. 2. FIG. 2 is an equivalent circuit diagram of a pixel of a liquid crystal display according to an embodiment of the present invention. A display panel assembly of the liquid crystal display includes a lower display panel 100 and an upper display panel 200 which face each other, and a liquid crystal layer 3 interposed between the lower display panel 100 and the upper display panel 200.

Each pixel PX includes a thin film transistor $Q_p$, which is a switching element connected to a gate line $G_i$ and a data line $D_j$, and a liquid crystal capacitor $C_{lc}$ and a storage capacitor $C_{st}$ which are connected to the thin film transistor $Q_p$. If unnecessary, the storage capacitor $C_{st}$ may be omitted.

The switching thin film transistor $Q_p$, is a three-terminal element provided on the lower display panel 100 and it has a control terminal connected to the gate line $G_i$, an input terminal connected to the data line $D_j$, and an output terminal connected to the liquid crystal capacitor $C_{lc}$ and the storage capacitor $C_{st}$.

In FIG. 2, undefined reference numeral 193 is a pixel electrode provided on the lower display panel 100, and reference numeral 270 is a common electrode provided on the upper display panel 200. The arrangement (orientations) of liquid crystal molecules varies depending on the amplitude of an electric field generated between the across the liquid crystal layer 3, thereby controlling the transmittance of light passing through the liquid crystal layer 3.

Figure 3:
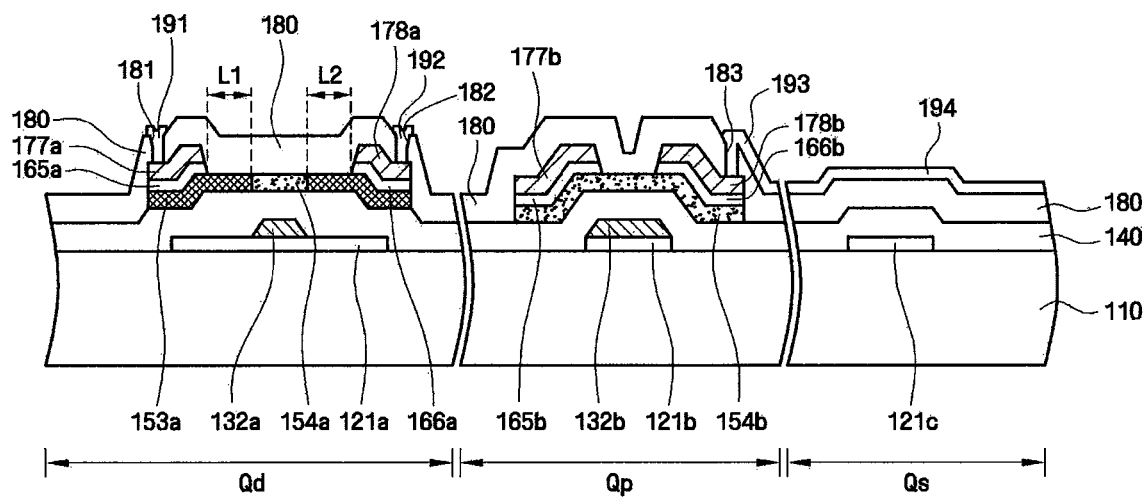
FIG. 3 is a cross-sectional view of a thin film transistor of a driving unit, a thin film transistor of a pixel unit, and a storage unit in a display device according to an embodiment of the present invention.

A thin film transistor of a driving unit, a thin film transistor of a pixel unit, and a storage unit in the display device according to an embodiment of the present invention will now be described with reference to FIG. 3. FIG. 3 is a cross-sectional view of a thin film transistor of a driving unit, a thin film transistor of a pixel unit, and a storage unit in a display device according to an embodiment of the present invention.

To distinguish a thin film transistor $Q_d$ of the driving unit from a thin film transistor $Q_p$ of the pixel unit, 'circuit' will be added to the thin film transistor $Q_d$, 'pixel' will be added to the thin film transistor $Q_p$, and 'storage' will be added to a storage unit $Q_s$.

On an insulating substrate 110, a first circuit gate electrode 121a is formed in a driving unit region, a first pixel gate electrode 121b is formed in a pixel unit region, and a storage lower electrode 121c is formed in a storage unit region. The first circuit gate electrode 121a, the first pixel gate electrode 121b, and the storage lower electrode 121c may be formed of transparent conductive layers.

A second circuit gate electrode 132a is formed on the first circuit gate electrode 121a and a second pixel gate electrode 132b is formed on the first pixel gate electrode 121b. The second pixel gate electrode 132b formed on the first pixel gate electrode 121b is connected with a gate line. The width of the second gate electrode 132a may be smaller than that of the first circuit gate electrode 121a. The second circuit gate electrode 132a and the second pixel gate electrode 132b may be formed of metal layers.

A gate insulating layer 140 made of silicon nitride or silicon oxide is formed on the first circuit gate electrode 121a, the first pixel gate electrode 121b, and the storage lower electrode 121c.

Circuit semiconductors 153a and 154a and a pixel semiconductor 154b are formed on the gate insulating layer 140.

The circuit semiconductors 153a and 154a include a first circuit semiconductor 153a and a second circuit semiconductor 154a formed in the same layer of the driving unit region. The first circuit semiconductor 153a includes a polycrystalline semiconductor, for example, polycrystalline silicon, and overlaps the first circuit gate electrode 121a. The second circuit semiconductor 154a includes an amorphous semiconductor, for example, amorphous silicon, and overlaps the second circuit gate electrode 132a.

The pixel semiconductor 154b includes an amorphous semiconductor, for example, amorphous silicon, and overlaps the second pixel gate electrode 132b.

The first circuit semiconductor 153a including the polycrystalline semiconductor can be made by irradiating a laser beam to the amorphous semiconductor from a rear side of the first circuit gate electrode 121a to crystallize the amorphous semiconductor. At this time, the width of the second circuit semiconductor 154a may be equal to or smaller than that of the second circuit gate electrode 132a. The laser beam irradiated from the rear side of the insulating substrate 110 passes through the first circuit gate electrode 121a, but is blocked by the second circuit gate electrode 132a. For this reason, the first circuit semiconductor 153a is melted by the laser beam, but the heat energy of the laser beam is not delivered to the second circuit semiconductor 154a. Thus, during laser beam irradiation, the temperature of the second circuit semiconductor 154a is lower than that of the first circuit semiconductor 153a and thus a temperature gradient occurs in a boundary between the first circuit semiconductor 153a and the second circuit semiconductor 154a, resulting in formation of a columnar structure crystal grain along the boundary from the first circuit semiconductor 153a towards the second circuit semiconductor 154a.

By selectively irradiating the laser beam only to the driving unit from the rear side of the first circuit gate electrode 121a after forming the first circuit gate electrode 121a with a transparent conductive layer and the second circuit gate electrode 132a with a metal layer, the second circuit semiconductor 154a, which is light-blocked by the second circuit gate electrode 132a, stays in an amorphous-semiconductor state and the first circuit semiconductor 153a, which is crystallized by the laser beam passing through the first circuit gate electrode 121a, enters a polycrystalline-semiconductor state.

In this way, the circuit semiconductors 153a and 154a formed in the same layer of the driving unit can be simultaneously formed as a polycrystalline semiconductor and an amorphous semiconductor without a need for a separate mask process.

On the other hand, since crystallization using a laser beam occurs selectively only in the circuit semiconductors 153a and 154a of the driving unit region, the pixel semiconductor 154b of the pixel unit region maintains the amorphous-semiconductor state.

On the first circuit semiconductor 153a and the pixel semiconductor 154b, a circuit source electrode 177a, a circuit drain electrode 178a, a pixel source electrode 177b, and a pixel drain electrode 178b are formed.

The circuit source electrode 177a and the circuit drain electrode 178a are formed to face with a predetermined interval therebetween on the first circuit semiconductor 153a, and the second circuit semiconductor 154a is exposed through the interval. As illustrated in FIG. 3, a semiconductor region, which is exposed through the interval between the circuit source electrode 177a and the circuit drain electrode 178a, may include a portion of the first circuit semiconductor 153a and the second circuit semiconductor 154a. The portion of the first circuit semiconductor 153a overlaps the circuit source electrode 177a or the circuit drain electrode 178a. If the length of a valid channel within the second circuit semiconductor 154a on the second circuit gate electrode 121a is 2 μm and a voltage Vd of 10V is applied between the circuit source electrode 177a and the circuit drain electrode 178a, a high on-current $I_{on}$ and a low leakage current $I_{off}$ can be effectively obtained when a distance L1 between the second circuit semiconductor 154a and the circuit source electrode 177a or a distance L2 between the second circuit semiconductor 154a and the circuit drain electrode 178a is between 1-40 μm. For a margin of a patterning process, the distance L1 or L2 is preferably larger than 1 μm. If the distance L1 or L2 exceeds 40 μm, the on-current $I_{on}$ decreases to a level of an on-current of an amorphous silicon thin film transistor.

The thickness of the second circuit semiconductor 154a exposed through the interval between the circuit source electrode 177a and the circuit drain electrode 178a may be smaller than that of the first circuit semiconductor 153a. The thickness of the pixel semiconductor 154b exposed through the interval between the pixel source electrode 177b and the pixel drain electrode 178b may be smaller than that of the pixel semiconductor 154b that overlaps the pixel source electrode 177b and the pixel drain electrode 178b. This is due to back channel etch (BCE) which will be described below.

Ohmic contact members 165a, 165b, 166a, and 166b are formed between the circuit source electrode 177a and the first circuit semiconductor 153a, between the circuit drain electrode 178a and the first semiconductor 153a, between the pixel source electrode 177b and the pixel semiconductor 154b, and between the pixel drain electrode 178b and the pixel semiconductor 154b, respectively. The ohmic contact members 165a, 165b, 166a, and 166b may be made of n+ hydrogenated amorphous silicon, n+ crystalline silicon doped with high concentration impurity such as phosphorus (P) or silicide.

The ohmic contact members 165a, 165b, 166a, and 166b may have substantially the same plane shape as the circuit source electrode 177a, the circuit drain electrode 178a, the pixel source electrode 177b, and the pixel drain electrode 178b.

The ohmic contact members 165a and 166a may overlap only portions of the circuit source electrode 177a and the circuit drain electrode 178a on the plane.

A passivation layer 180 is formed on the pixel source electrode 177a, the circuit drain electrode 178a, the pixel source electrode 177b, and the circuit drain electrode 178a.

A plurality of contact holes 181, 182, and 183, which expose the circuit source electrode 177a, the circuit drain electrode 178a, and the pixel drain electrode 178b, respectively, are formed in the passivation layer 180.

Conductors 191 and 192 connected with the pixel source electrode 177a and the circuit drain electrode 178a through the contact holes 181 and 182, and a pixel electrode 193 connected with the pixel drain electrode 178b through the contact hole 183 are formed on the passivation layer 180. The pixel electrode 193 connected with the pixel drain electrode 178b extends to the storage unit in order to form a storage upper electrode 194. The storage upper electrode 194, the storage lower electrode 121c, and a dielectric made of the gate insulating layer 140 and the passivation layer 180 between the storage upper electrode 194 and the storage lower electrode 121c constitute a storage capacitor.

In an embodiment of the present invention, the storage lower electrode 121c may be formed of a transparent conductive layer in order to improve transmittance.

In such a display device, the first circuit gate electrode 121a, the second circuit gate electrode 132a, the first circuit semiconductor 153a, the second circuit semiconductor 154a, the circuit source electrode 177a, and the circuit drain electrode 178a form the circuit thin film transistor $Q_d$.

Likewise, the first pixel gate electrode 121b, the second pixel gate electrode 132b, the pixel semiconductor 154b, the pixel source electrode 177b, and the pixel drain electrode 178b form the pixel thin film transistor $Q_p$.

As such, in the circuit thin film transistor $Q_d$ according to an embodiment of the present invention, channel regions of circuit semiconductors are formed of an amorphous semiconductor and a pixel semiconductor connected to a source electrode and a drain electrode is formed of a polycrystalline semiconductor, whereby higher carrier mobility and lower leakage current than a thin film transistor formed of only an amorphous semiconductor can be obtained and thus an operation range of the circuit thin film transistor $Q_d$ can be expanded.

Hereinafter, a method of manufacturing the display device illustrated in FIG. 3 will be described in detail with reference to FIGS. 4 through 12.

FIGS. 4 through 12 are cross-sectional views showing processes of a method of manufacturing the display device illustrated in FIG. 3 according to an embodiment of the present invention.

Figure 4:
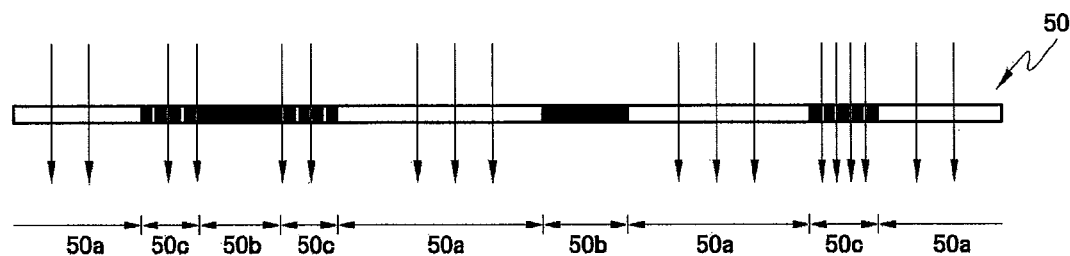
FIGS. 4 through 12 are cross-sectional views showing processes of a method of manufacturing the display device illustrated in FIG. 3 according to an embodiment of the present invention.

Referring to FIG. 4, a transparent conductive layer 120 is formed on the insulating substrate 110 and a metal layer 130 is formed on the conductive layer 120.

A photosensitive layer is coated onto the metal layer 130 and a mask 50 is disposed on the photosensitive layer for light exposure. The mask 50 includes a light-transmitting region 50a, a light-blocking region 50b, and a semi-light-transmitting region 50c. The semi-light-transmitting region 50c may have a patterned slit, a lattice pattern, or a thin film having an intermediate transmittance or thickness. When the semi-light-transmitting region 50c uses the patterned slit, the width of a slit or an interval between slits is preferably smaller than the resolution of a light exposure system used in a lithographic process.

The mask 50 is removed and the light-exposed photosensitive layer is developed to form a first photosensitive pattern 41a and a second photosensitive pattern 41b having a thickness that is larger than that of the first photosensitive pattern 41a. The first photosensitive pattern 41a is formed in a region where the first circuit gate electrode 121a and the storage lower electrode 121c are to be formed, and the second photosensitive pattern 41b is formed in a region where the second circuit gate electrode 132a, the first pixel gate electrode 121b, and the second pixel gate electrode 132b are to be formed.

Figure 5:
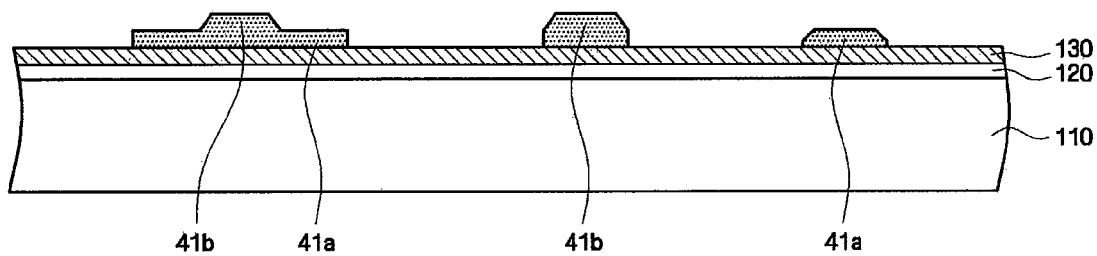

Referring to FIGS. 4 and 5, the transparent conductive layer 120 and the metal layer 130 are sequentially etched by using the first photosensitive pattern 41a and the second photosensitive pattern 41b as etching masks, whereby an island-shape pattern is formed. The first photosensitive pattern 41a having a relatively small thickness is removed by using an etch-back process, e.g., ashing.

Figure 6:
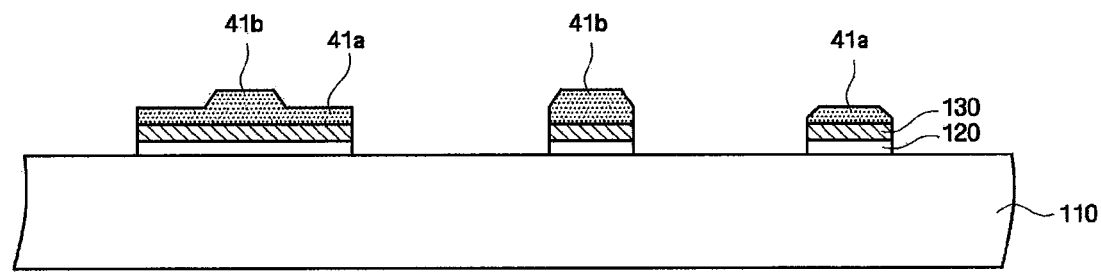

Referring to FIG. 6, the exposed metal layer 130 is etched by using the remaining second photosensitive pattern 41b as an etching mask and then the second photosensitive pattern 41b is removed, thereby forming the first circuit gate electrode 121a, the second circuit gate electrode 132a, the first pixel gate electrode 121b and the second pixel gate electrode 132b including gate lines, and the storage lower electrode 121c. The first circuit gate electrode 121a and the second circuit gate electrode 132 thereon are formed in the shape of 凸, and the first pixel gate electrode 121b and the second pixel gate electrode 132b are formed to have the same width. The storage lower electrode 121c is formed as a single layer made of a transparent conductive film. The width of the second pixel gate electrode 132b may be smaller than that of the first pixel gate electrode 121b according to etching conditions.

Figure 7:
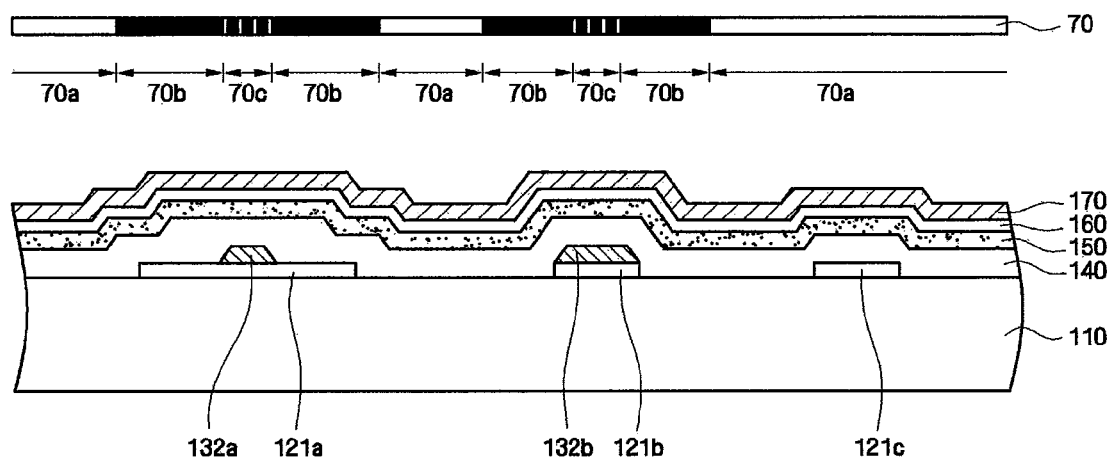

Referring to FIG. 7, the gate insulating layer 140, a semiconductor layer 150, an ohmic contact layer 160, and a metal layer 170 are sequentially deposited on the first circuit gate electrode 121a, the second circuit gate electrode 132a, the second pixel gate electrode 132b, and the storage lower electrode 121c. A photosensitive layer (not shown) is coated onto the resultant structure and then is exposed to light by using a mask 70. The mask 70 has a light-transmitting region 70a, a light-blocking region 70b, and a semi-light-transmitting region 70c. The semi-light-transmitting region 70c may have a patterned slit, a lattice pattern, or a thin film having an intermediate transmittance or thickness. When the semi-light-transmitting region 50c uses the patterned slit, the width of a slit or an interval between slits is preferably smaller than the resolution of a light exposure system used in a lithographic process.

Figure 8:
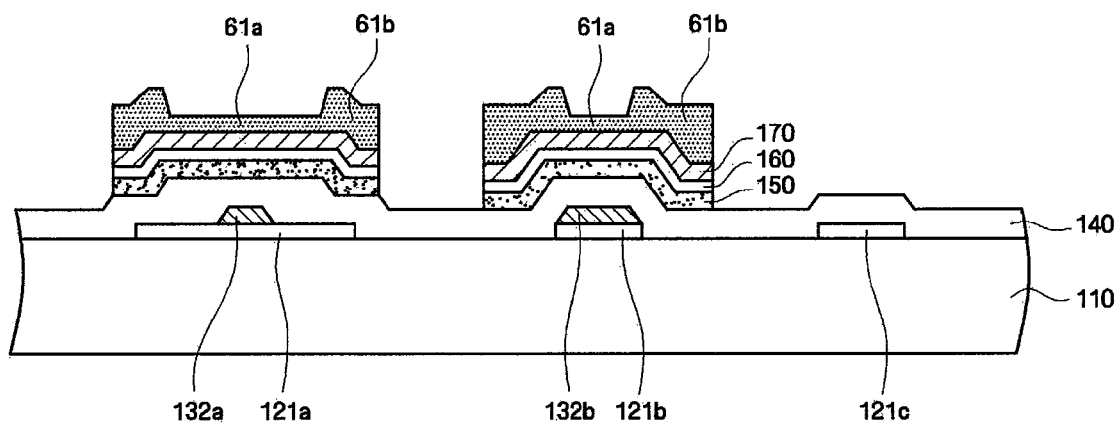

Referring to FIG. 8, the mask 70 is removed and the light-exposed photosensitive layer is developed to form a first photosensitive pattern 61a and a second photosensitive pattern 61b having a larger thickness than the first photosensitive pattern 61a. The first photosensitive pattern 61a is formed in a position corresponding to channel regions of the first circuit semiconductor 153a and the pixel semiconductor 154b, and the second photosensitive pattern 61b is formed in a position where the pixel source electrode 177a, the circuit drain electrode 178a, the pixel source electrode 177b, and the pixel drain electrode 178b are to be formed.

The metal layer 170, the ohmic contact layer 160, and the semiconductor layer 150 are sequentially etched by using the first photosensitive pattern 61a and the second photosensitive pattern 61b as etching masks, whereby a plurality of source electrodes and drain electrodes, a plurality of ohmic contact patterns, and a semiconductor are formed. Only the gate insulating layer 140 remains on the storage lower electrode 121c and a portion that is not covered with the first photosensitive pattern 61a and the second photosensitive pattern 61b.

Figure 9:
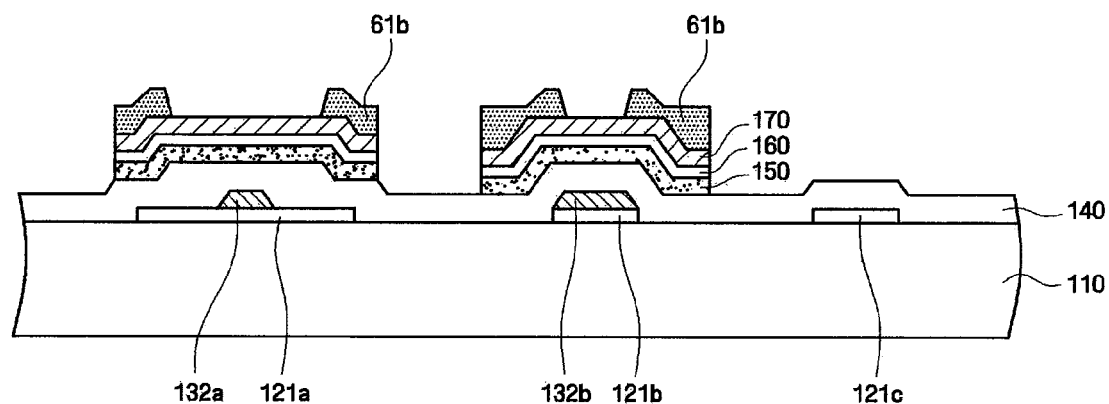
Figure 10:
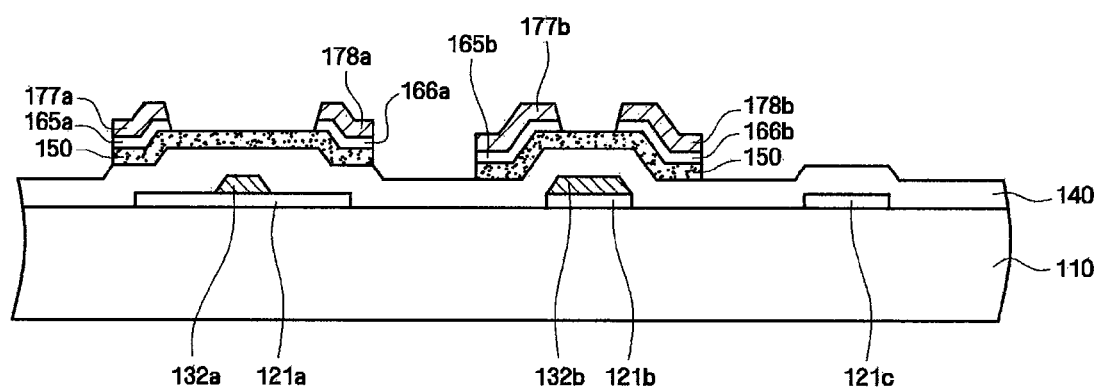

Referring to FIGS. 9 and 10, the first photosensitive pattern 61a is removed by using an etch-back process such as ashing. At this time, the thickness of the second photosensitive pattern 61b is also reduced. The metal layer 170 is etched by using the remaining second photosensitive pattern 61b as an etching mask, thereby forming the circuit source electrode 177a, the circuit drain electrode 178a, the pixel source electrode 177b, and the pixel drain electrode 178b. Portions of the ohmic contact layer 160 between the circuit source electrode 177a and the circuit drain electrode 178a and between the pixel source electrode 177b and the circuit drain electrode 178a are exposed.

The exposed portions of the ohmic contact layer 160 are dry-etched to form the ohmic contact members 165a, 165b, 166a, and 166b, and a portion of the semiconductor layer 150 of the driving unit and the pixel unit under the ohmic contact members 165a, 165b, 166a, and 166b is exposed. The thickness of the exposed portion of the semiconductor layer 150 under the ohmic contact members 165a, 165b, 166a, and 166b may be reduced. Such a process is called back-channel etch.

Figure 11:
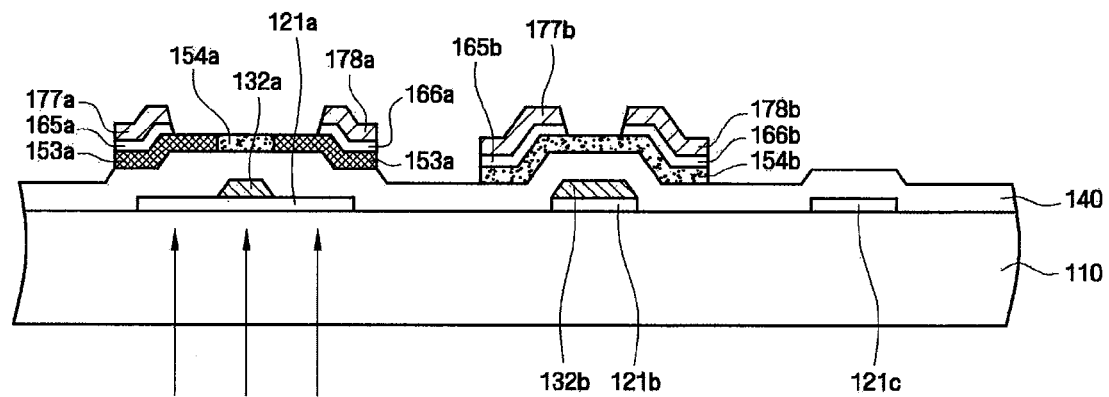

Referring to FIG. 11, a laser beam is selectively irradiated from a rear side of the first circuit gate electrode 121a to the semiconductor layer 150 of the circuit unit region, thereby crystallizing the first circuit semiconductor 153a of the circuit unit. At this time, the first circuit gate electrode 121a transmits the laser beam because of being formed of the transparent conductive layer 120, but the second circuit gate electrode 132a on the first circuit gate electrode 121a blocks the laser beam because of being formed of the metal layer. As a result, the second circuit semiconductor 154a on the second circuit gate electrode 132a exists as an amorphous semiconductor and the first circuit semiconductor 153a which overlaps the circuit source electrode 177a and the circuit drain electrode 178a is crystallized into a polycrystalline semiconductor. The semiconductor layer 150 of the pixel unit to which the laser beam is not irradiated is maintained as the pixel semiconductor 154b made of an amorphous semiconductor.

In this way, by performing laser-crystallization on the semiconductor layer 150 formed of an amorphous semiconductor on the insulating substrate 110 by using the second circuit gate electrode 132a as a mask without a need for an additional mask process, the semiconductor layer 150 corresponding to a channel region can be formed of an amorphous semiconductor and the semiconductor layer 150 overlapping the circuit source electrode 177a and the circuit drain electrode 178a can be formed of a polycrystalline semiconductor at the same time.

Figure 12:
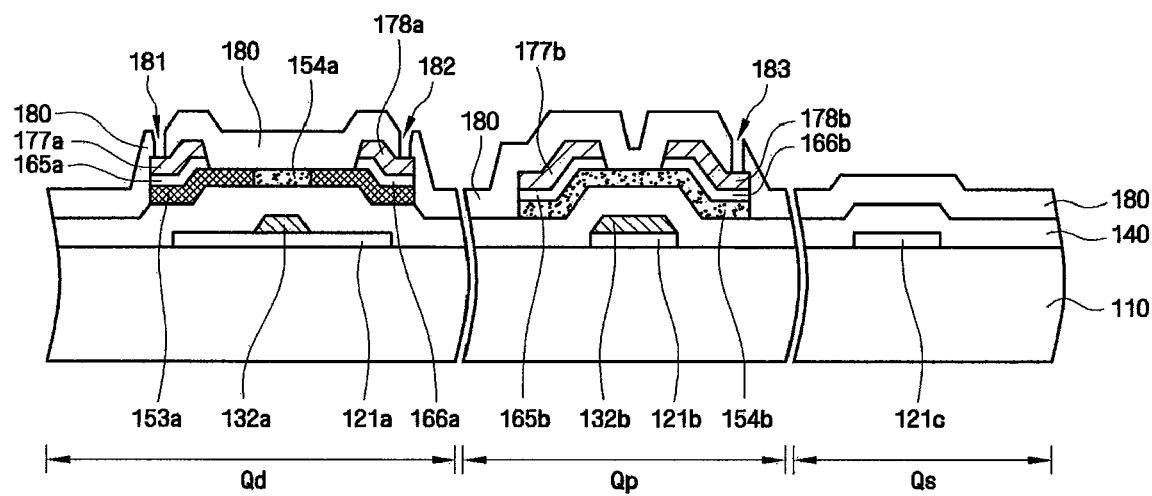

Referring to FIG. 12, the passivation layer 180 is deposited on the entire surface of the insulating substrate 110 and then is lithography-etched to form the contact holes 181, 182, and 183, which expose the circuit source electrode 177a, the circuit drain electrode 178a, and the pixel drain electrode 178b, respectively.

Referring back to FIG. 3, a conductive layer is deposited on the passivation layer 180 and then is lithography-etched to form the conductors 191 and 192 connected to the circuit source electrode 177a and the circuit drain electrode 178a through the contact holes 181 and 182, the pixel electrode 193 connected with the pixel drain electrode 178b through the contact hole 183, and the storage upper electrode 194. In the storage unit, the storage lower electrode 121c and the storage upper electrode 194 may be formed of transparent conductive layers for transmittance improvement.

As such, according to an embodiment of the present invention, a driving thin film transistor and a pixel thin film transistor, which require different characteristics, can be manufactured on a single insulating substrate by using the same manufacturing method and facilities. Thus, a gate driver and a data driver including the driving thin film transistor can be integrated onto the insulating substrate, thereby reducing the manufacturing cost of a display device.

Moreover, a thin film transistor having a short channel for on-current improvement can be manufactured as a thin film transistor formed of a combination of an amorphous semiconductor and a polycrystalline semiconductor, whereby, in the entire channel length, only a portion formed of the amorphous semiconductor serves as a valid channel and a portion formed of the polycrystalline semiconductor serves as a resistor, thereby suppressing leakage current increase caused by the short channel.

In the first embodiment of the present invention, the display panel is manufactured using four masks, which means that a single mask is used to form a semiconductor layer and a data wire. However, the present invention is not limited to the illustrated embodiment, and various modification of masking processes can be readily practiced by one skilled in the art. For example, a display panel can be manufactured using five masks by forming a semiconductor layer and a data wire using different masks. Alternatively, a display panel can be manufactured by employing a three-mask process by forming a passivation layer and a pixel electrode using a single mask. While a liquid crystal display has been described in the previous embodiment of the present invention by way of example, the invention can also be applied to all kinds of display devices including an organic EL display and an electrophorectic display.

As described above, according to the present invention, a driving unit and a pixel unit can be simultaneously formed of thin film transistors having different characters on the same substrate without a need for an additional mask process. Moreover, by applying a short channel to a thin film transistor of the driving unit, on-current can be improved, a high leakage current can be reduced, and the electric characteristic uniformity of a polycrystalline thin film transistor can be improved regardless of the etching dispersion of a source pattern and a drain pattern. Furthermore, a storage lower electrode in a pixel unit is formed by using a transparent conductive layer, thereby guaranteeing high transmittance.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A thin film transistor comprising:
    a first gate electrode;
    a second gate electrode formed on the first gate electrode;
    a first semiconductor formed on the first gate electrode and including a polycrystalline semiconductor; and
    a second semiconductor formed on the second gate electrode and including an amorphous semiconductor, the second gate electrode being disposed between the second semiconductor and the first gate electrode,
    wherein the first gate electrode is formed of a transparent conductive layer, and the second gate electrode is formed of a metal layer.

2. The thin film transistor of claim 1, wherein the first semiconductor and the second semiconductor are formed on the same layer.

3. The thin film transistor of claim 1, wherein a width of the second semiconductor is the substantially same as a width of the second gate electrode.

4. The thin film transistor of claim 1, wherein a width of the second gate electrode is smaller than a width of the first gate electrode and the second gate electrode does not overlap the first semiconductor.

5. The thin film transistor of claim 1, wherein a portion of the first semiconductor overlaps a source electrode or a drain electrode.

6. The thin film transistor of claim 5, wherein a distance between the second semiconductor and the source electrode or a distance between the second semiconductor and the drain electrode is between 1 and 40 µm.

7. A display device comprising:
    a first thin film transistor including a first circuit gate electrode, a second circuit gate electrode formed on the first circuit gate electrode, a first circuit semiconductor, a second circuit semiconductor, a circuit source electrode, and a circuit drain electrode; and
    a second thin film transistor including a first pixel gate electrode, a second pixel gate electrode formed on the first pixel gate electrode, a pixel semiconductor, a pixel source electrode, and a pixel drain electrode,
    wherein the first circuit semiconductor includes a polycrystalline semiconductor, and the second circuit semiconductor and the pixel semiconductor includes an amorphous semiconductor.

8. The display device of claim 7, wherein the first circuit semiconductor, the second circuit semiconductor, and the pixel semiconductor are formed on the same layer.

9. The display device of claim 7, wherein a width of the second circuit semiconductor is the substantially same as a width of the second circuit gate electrode.

10. The display device of claim 7, wherein the first circuit gate electrode and the first pixel gate electrode are formed of a transparent conductive layer, and the second circuit gate electrode and the second pixel gate electrode are formed of a metal layer.

11. The display device of claim 7, further comprising a storage upper electrode and a storage lower electrode.

12. The display device of claim 11, wherein at least one of the storage upper electrode and the storage lower electrode is formed of a transparent conductive layer.

13. The display device of claim 7, wherein the first thin film transistor is positioned in at least one of a gate driver and a data driver, and the second thin film transistor is positioned in a pixel unit.

14. The display device of claim 7, wherein a portion of the first circuit semiconductor overlaps the circuit source electrode or the circuit drain electrode.

15. The display device of claim 14, wherein a distance between the second circuit semiconductor and the circuit source electrode or a distance between the second circuit semiconductor and the circuit drain electrode is between 1 and 40 µm.

16. The thin film transistor of claim 1, wherein the second semiconductor is disposed between a first portion of the first semiconductor and a second portion of the first semiconductor.

17. A thin film transistor comprising:
    a first gate electrode including a first conductive material;
    a second gate electrode overlapping the first gate electrode and including a second conductive material that is different from the first conductive material;
    a first semiconductor disposed on the first gate electrode and including a first semiconductor material; and
    a second semiconductor disposed on the second gate electrode and including a second semiconductor material that is different from the first semiconductor material,
    wherein the second gate electrode and the second semiconductor are completely overlapped by the first gate electrode.

18. The thin film transistor of claim 17, wherein the second gate electrode contacts the first gate electrode.

19. The thin film transistor of claim 17, wherein the second gate electrode is disposed between the second semiconductor and the first gate electrode.

* * * * *